United States Patent
Kim

(10) Patent No.: US 7,919,918 B2
(45) Date of Patent: Apr. 5, 2011

(54) ORGANIC LIGHT EMITTING DISPLAY DEVICE

(75) Inventor: Eun-Ah Kim, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 1028 days.

(21) Appl. No.: 11/590,558

(22) Filed: Oct. 31, 2006

(65) Prior Publication Data

US 2007/0103063 A1    May 10, 2007

(30) Foreign Application Priority Data

Nov. 9, 2005  (KR) .................. 10-2005-0107028

(51) Int. Cl.
*H01J 51/00*    (2006.01)
(52) U.S. Cl. ........................ 313/506; 313/512
(58) Field of Classification Search .............. 313/506, 313/512
See application file for complete search history.

(56) References Cited

U.S. PATENT DOCUMENTS 5,799,080 A * 8/1998 Padmanabhan et al. ...... 713/193
6,307,613 B1  10/2001 Iida
2002/0101177 A1* 8/2002 Bae et al. .................. 315/169.3
2002/0158835 A1* 10/2002 Kobayashi et al. ........... 345/100
2005/0104097 A1* 5/2005 Hirose et al. .................. 257/288

FOREIGN PATENT DOCUMENTS

| JP | 10-209581 | 8/1998 |
| JP | 2002-367523 | 12/2002 |
| JP | 2005-283830 | 10/2005 |
| KR | 10-2004-0058840 | 7/2004 |

OTHER PUBLICATIONS

Chinese Registration Determination Certificate issued on Aug. 11, 2010 by the Chinese Intellectual Property Office in connection with corresponding Korean Patent Application No. 2005-0107028.

* cited by examiner

*Primary Examiner* — Joseph L Williams
*Assistant Examiner* — Hana S Featherly
(74) *Attorney, Agent, or Firm* — Knobbe Martens Olson & Bear, LLP.

(57) ABSTRACT

Provided is an organic light emitting display device that reduces a unused area and reduces the voltage drop of a driving power bus line. The organic light emitting display device includes a pixel region having a plurality of organic light emitting diodes; a power bus line that is located on an outer side of the pixel region and supplies power to each of the organic light emitting diodes; and a metal layer that overlaps the driving power bus line, is electrically connected to the driving power bus line, and comprises a panel mark.

16 Claims, 6 Drawing Sheets

ORGANIC LIGHT EMITTING DISPLAY DEVICE

CROSS-REFERENCE TO RELATED PATENT APPLICATION

This application claims the benefit of Korean Patent Application No. 10-2005-0107028, filed on Nov. 9, 2005, in the Korean Intellectual Property Office, the disclosure of which is incorporated herein in its entirety by reference.

BACKGROUND OF THE INVENTION

1. Field of the Invention

The present invention relates to an organic light emitting display device, and more particularly, to an organic light emitting display device with reduced unused image area because of a panel identification mark, and with low resistance power bus lines.

2. Description of the Related Technology

A panel identification mark is included in a flat panel display device such as a liquid crystal display device, an organic light emitting display device, or an inorganic light emitting display device, to allow convenient identification, tracking of the panel, and evaluation of the display cells.

The panel identification mark is located on a separate area outside the display region where images are displayed. Therefore, the space occupied by the panel identification mark is unused space, where images are not displayed, and the unused space increases in area as the size of the panel identification mark increases.

Accordingly, in the conventional art, the panel identification mark is usually located in existing unused space, for instance under a driving chip, where it does not affect other signals and does not need additional area.

However, when the panel identification mark is formed under the driving chip, it is difficult to identify the panel identification mark after the driving chip is mounted.

Also, the liquid crystal display device in the conventional art does not supply additional power to each of the pixels. However, in the case of an active matrix (AM) organic light emitting display device, a power supply line for supplying power to each pixel must be extended. Accordingly, the unused area in the panel is further increased. Therefore, it is difficult to lay out the panel identification mark without increasing the unused area of the panel.

SUMMARY OF THE CERTAIN INVENTIVE ASPECTS

An organic light emitting display device that reduces unused area and reduces a drive voltage drop is disclosed.

One embodiment is a organic light emitting display device including a pixel region having a plurality of organic light emitting diodes, a power bus line located outside of the pixel region and configured to supply power to each of the organic light emitting diodes, and a metal layer located above or below the power bus line and electrically connected to the power bus line and including a panel mark.

Another embodiment is a organic light emitting display device including a pixel region having a plurality of organic light emitting diodes, an electrically operative line including first and second conductors, the first conductor protecting the second conductor from corrosion, and the second conductor having conductivity higher than the first conductor.

Another embodiment is a organic light emitting display device including a pixel region having a plurality of organic light emitting diodes, and an electrically operative line including a panel identification mark.

BRIEF DESCRIPTION OF THE DRAWINGS

The above and other features and advantages will become more apparent with disclosure of embodiments discussed with reference to the attached drawings in which.

DETAILED DESCRIPTION OF CERTAIN INVENTIVE EMBODIMENTS

Certain embodiments will now be described more fully with reference to the accompanying drawings.

Figure 1:
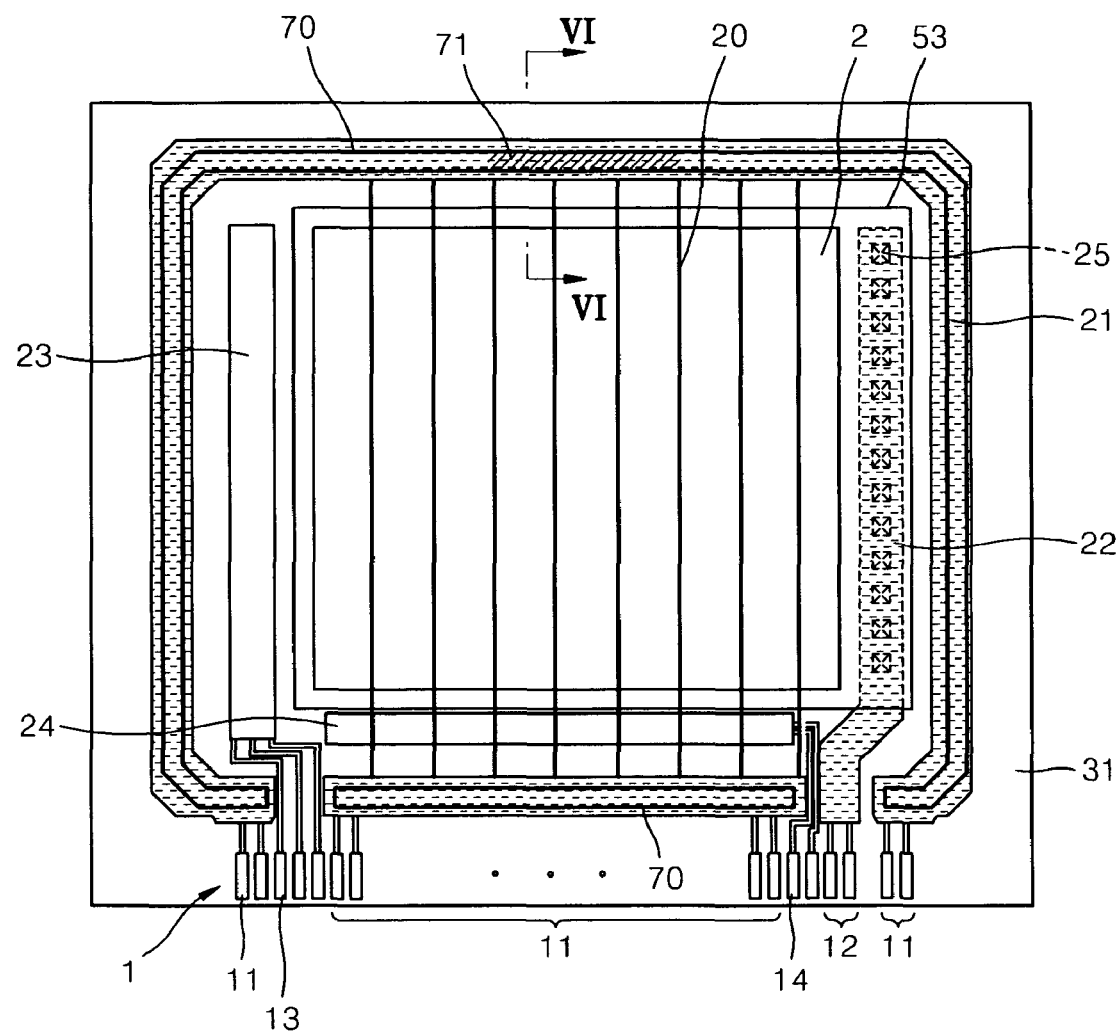
FIG. 1 is a plan view of an organic light emitting display device according to an embodiment.

FIG. 1 is a plan view of an active matrix (AM) organic light emitting display device according to an embodiment.

Referring to FIG. 1, a display region 2 where images are displayed is formed on a substrate 31. The display region 2 is sealed by an additional sealing member (not shown) to protect the display region 2 from impact, moisture, and air. The sealing member may be, for example, an insulating substrate or a metal cap.

Another embodiment is a terminal region 1 comprising terminals is located on an end portion of the substrate 31 where the display region 2 is formed. The terminal region 1 is exposed outside the sealing member.

Around the display region 2, a driving power bus line 21 for supplying driving power to a VDD line 20, an electrode power bus line 22 connected to a facing electrode 53 to supply facing electrode power, and various circuits 23 and 24 that control signals applied to the display region 2.

Areas where the terminal region 1, the driving power bus line 21, the electrode power bus line 22, and the circuits 23 and 24 are located correspond to an unused area where images are not displayed.

The driving power bus line 21 is formed to surround the entire display region 2 from an end of a driving power terminal unit 11 to the other end of the driving power terminal unit 11, and also, is disposed in a lower side of the display region 2 by being connected through driving power lines 20 that cross the display region 2.

The electrode power bus line 22, which is electrically connected to an electrode of the organic light emitting display device in the display region 2 and will be described in detail later, is formed on a side of the display region 2. The electrode connected to the electrode power bus line 22 can be extended to cover the electrode power bus line 22. An insulating film is interposed between the electrode connected to the electrode power bus line 22 and the electrode power bus line 22, and the electrode and the electrode power bus line 22 are connected through a plurality of contact holes 25.

The vertical circuit unit 23 and the horizontal circuit unit 24 are mounted between the driving power bus line 21 and the display region 2. The vertical circuit unit 23 can be a scan driving circuit unit that applies scan signals to gate lines of the display region 2, and is electrically connected to a scan terminal unit 13 in the terminal region 1. The horizontal circuit unit 24 can be a data driving circuit unit that applies data signals to data lines of the display region 2, and is electrically connected to a data terminal unit 14 in the terminal region 1. The vertical circuit unit 23 and the horizontal circuit unit 24 can be formed on the substrate 31 using a patterning method, or can include an external IC or COG.

Figure 2:
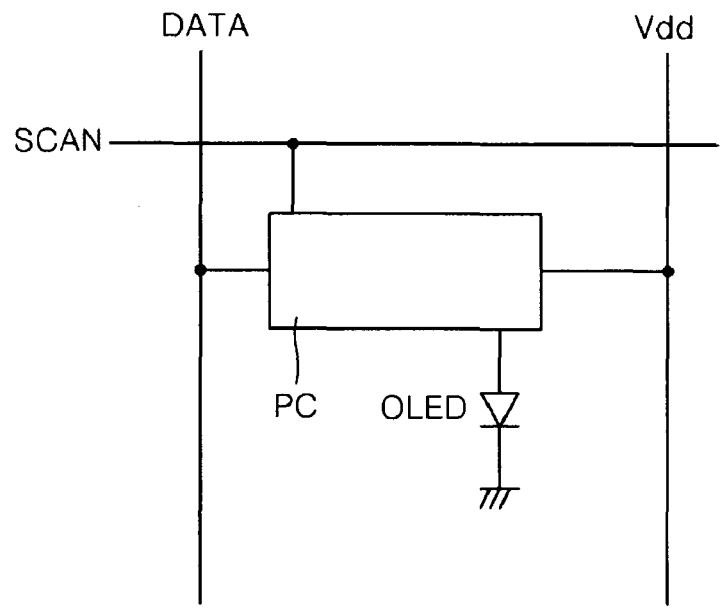
FIG. 2 is a schematic diagram of a unit pixel of an organic light emitting display device including a pixel circuit according to an embodiment.

The display region 2 includes a plurality of pixels, each of which can have a pixel circuit as depicted in FIG. 2.

Referring to FIG. 2, each pixel includes a data line Data, a scan line Scan, and a Vdd line Vdd that supplies driving power to an organic light emitting diode (OLED). The Vdd line Vdd is the Vdd line of FIG. 1.

The pixel circuit PC of each pixel is electrically connected to the data line, the scan line Scan, and the Vdd line Vdd, and controls the light emission of the OLED.

Figure 3:
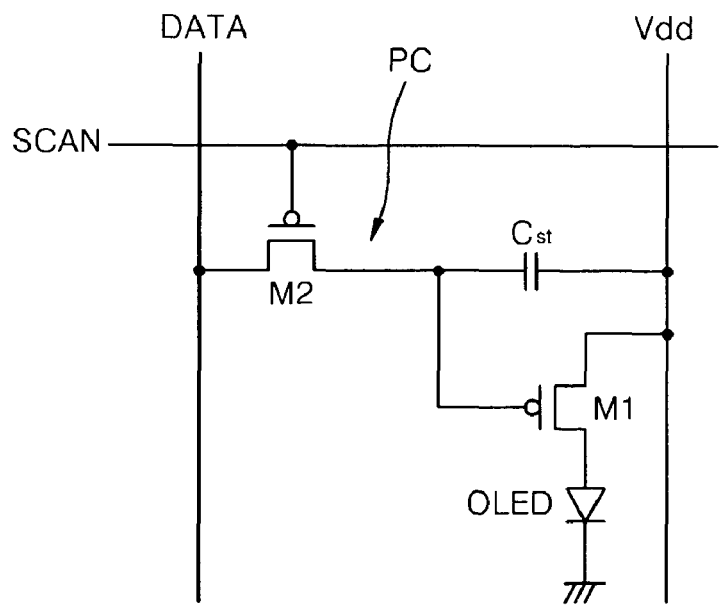
FIG. 3 is a detailed schematic diagram of the unit pixel of FIG. 2.

FIG. 3 is a detailed schematic diagram of the unit pixel of FIG. 2. The pixel circuit PC of each pixel includes two thin film transistors M1 and M2 and one capacitor unit Cst.

Referring to FIG. 3, each pixel of the organic light emitting display device according to an embodiment, includes at least two thin film transistors (TFTs), i.e. a switching TFT M2 and a driving TFT M1, a capacitor unit Cst, and an OLED.

The switching TFT M2 is turned on or off by a scan signal applied to a scan line Scan to transmit a data signal applied to the data line Data to the storage capacitor unit Cst and the driving TFT M1. According to embodiments of the present invention, the switching device is not limited to the switching TFT M2 depicted in FIG. 4, and can be a switching circuit having a plurality of TFTs and capacitors, or can further include a circuit that compensates for a threshold voltage Vth value of the driving TFT M1 or a circuit that compensates for a voltage drop of the Vdd power line Vdd.

The driving TFT M1 determines the current input to the OLED according to a data signal transmitted through the switching TFT M2.

The capacitor unit Cst stores the data signal transmitted from the switching TFT M2 for one frame period.

In the circuit diagram of FIG. 3, the driving TFT M1 and the switching TFT M2 are depicted as PMOS TFTs, but other transistors may also be used. One or both of the driving TFT M1 and the switching TFT M2 can be an NMOS TFT. Also, the number of TFTs and capacitors is not limited to that shown in FIG. 3, and can be increased as necessary.

Figure 4:
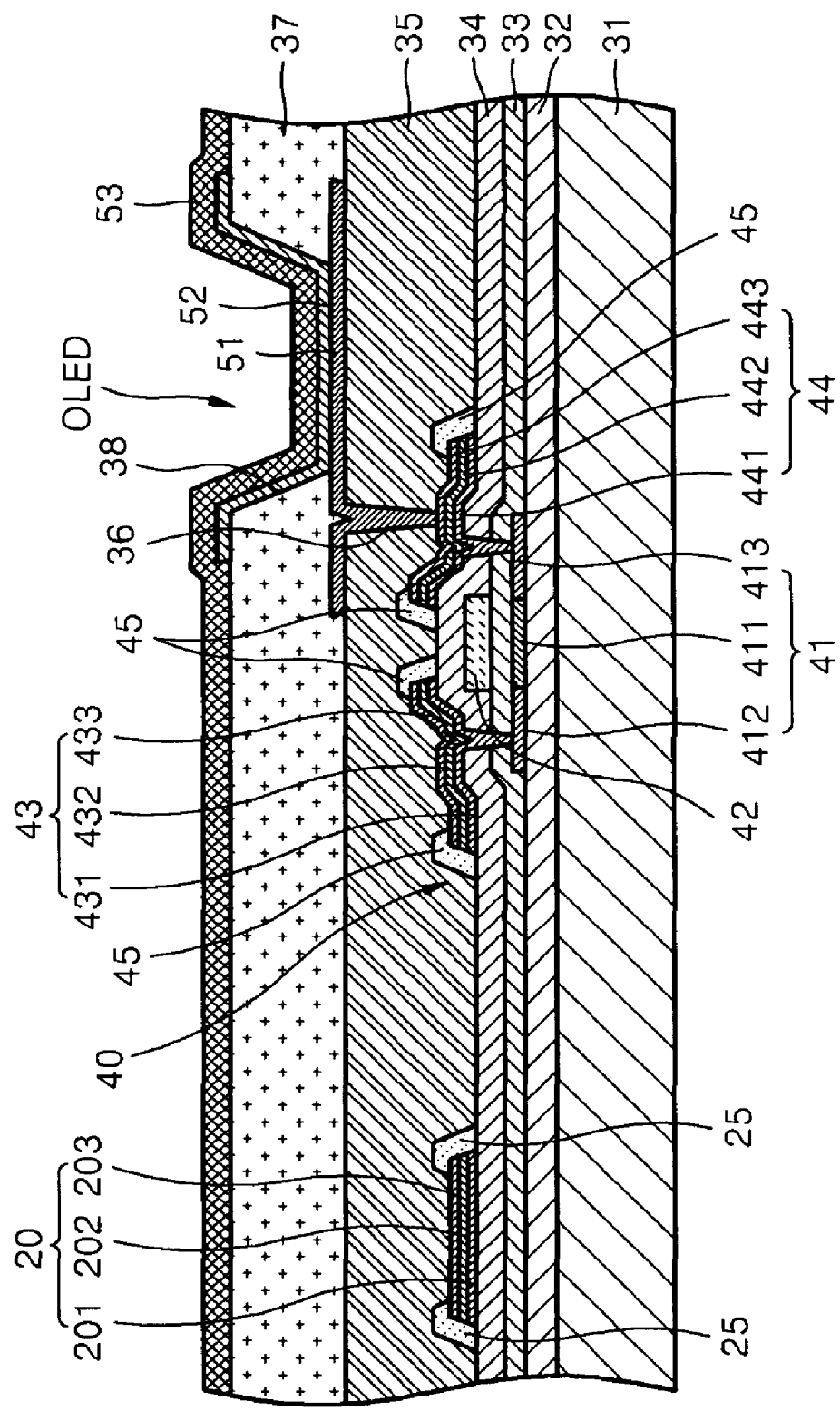
FIG. 4 is cross-sectional view of the circuit of FIG. 3.

In one embodiment, the pixel circuit PC has a cross-sectional structure as depicted in FIG. 4. FIG. 4 is a cross-sectional view of a portion of the pixel of FIG. 3.

Referring to FIG. 4, a TFT 40 and an OLED are included on a substrate 31.

The substrate 31 can be formed of acryl, polyimide, polycarbonate, polyester, mylar, or a plastic material, but embodiments are not limited to these materials, and the substrate 31 can be formed of a metal foil such as SUS, tungsten, etc., glass or another material or combination of materials.

Although not depicted, a barrier layer and/or a buffer layer can be formed on the upper surface of the substrate 31 to prevent the diffusion of impurity ions, prevent the penetration of moisture or external air, and/or planarize the surface.

An active layer 41 of the TFT 40 is formed on the insulating layer 32 using a semiconductor material, and a gate insulating film 33 is formed to cover the active layer 41. The active layer 41 can be formed of an inorganic semiconductor material such as amorphous silicon, polysilicon, or an organic semiconductor material. The active layer 41 includes a channel region 411 between a source region 412 and a drain region 413.

Another embodiment is a gate electrode 42 is formed on the gate insulating film 33, and an interlayer insulating film 34 covering the gate electrode 42 is formed. Another embodiment is a source electrode 43 and a drain electrode 44 are formed on the interlayer insulating film 34. Another embodiment is a passivation film 35 and a pixel defining film 37 are sequentially formed to cover the source electrode 43 and the drain electrode 44.

The gate insulating film 33, the interlayer insulating film 34, the passivation film 35, and the pixel defining film 37 can each have a single layer structure or a multi-layer structure, and can be formed of an organic material, an inorganic material, or a composite of organic and inorganic materials.

The stacking structure of a TFT according to these embodiments is not limited to that of the TFT 40, and various TFT structures can be used.

Another embodiment is a pixel electrode 51, which is an electrode of the OLED, is formed on the passivation film 35, and a pixel defining film 37 is formed on the pixel electrode 51. After exposing the pixel electrode 51 through a predetermined opening 38 in the pixel defining film 37, an organic light emitting film 52 of the OLED is formed.

The OLED emits red, green, or blue light according to the current supplied to form a predetermined image, and comprises the pixel electrode 51 that contacts the drain electrode 44 of the TFT 40 through a contact hole 36, a facing electrode 53 covering all of the pixels, and the organic light emitting film 52, which is located between the pixel electrode 51 and the facing electrode 53 and emits light.

The pixel electrode 51 and the facing electrode 53 are insulated from each other by the organic light emitting film 52, and apply voltages of opposite polarity to the organic light emitting film 52 so that the organic light emitting film 52 emits light.

The organic light emitting film 52 can be, for example, a small molecular weight organic film or a polymer organic film. If the organic light emitting film 52 is a small molecular weight organic film, the organic light emitting film 52 can include a hole injection Layer (HIL), a hole transport layer (HTL), an emission layer (EML), an electron transport layer (ETL), or an electron injection layer (EIL), can be stacked in a single structure or a composite structure, and can be composed of copper phthalocyanine (CuPc), N,N'-di(naphthalene-1-yl)-N,N'-diphenyl-benzidine (NPB), or tris-8-hydroxyquinoline aluminum (Alq3). The small molecular weight organic film can be formed using a vacuum evaporation method. The HIL, the HTL, the ETL, and the EIL are common electrodes, and can be commonly formed in red, green, and blue pixels. Accordingly, the common electrodes can cover the pixels like the facing electrode 53.

If the organic light emitting film 52 is formed of a polymer organic film, the organic light emitting film 52 can include a HTL and an EML. The HTL can be formed of PEDOT, and the EML can be formed of poly-phenylenevinylene (PPV) and polyfluorene. The polymer organic film can be formed by screen printing, ink jet printing, etc.

The organic light emitting film 52 is not limited to the configuration described above, and can take various forms.

The pixel electrode 51 functions as an anode electrode, and the facing electrode 52 functions as a cathode electrode. In some embodiments, the polarity of the pixel electrode 51 and the facing electrode 53 may be reversed.

In the case of a bottom emission type display device, the pixel electrode 51 can be a transparent electrode, and the facing electrode 53 can be a reflective electrode. The pixel electrode 51 can comprise a transparent material having a high work function, such as, but not limited to ITO, IZO, $In_2O_3$, or ZnO, and the facing electrode 53 can comprise a reflective metal having a low work function, such as, but not limited to Ag, Mg, Al, Pt, Pd, Au, Ni, Nd, Ir, Cr, Li, Ca, or a compound of these metals.

In the case of a top emission type display device, the pixel electrode 51 can be a reflective electrode, and the facing electrode 53 can be a transparent electrode. The pixel electrode 51 can be formed of a material having a high work function such as, but not limited to, ITO, IZO, $In_2O_3$, or ZnO after forming a reflective film using Ag, Mg, Al, Pt, Pd, Au, Ni, Nd, Ir, Cr, Li, Ca, or a compound of these metals. The facing electrode 53 can include a material layer comprising a metal having a low work function, such as, but not limited to, Li, Ca, LiF/Ca, LiF/Al, Al, Ag,. Mg, or a compound of these metals, and an auxiliary electrode layer or a bus electrode line comprising a transparent conductive material, such as, but not limited to, ITO, IZO, ZnO or $In_2O_3$, formed on the material layer.

In the case of a double sided emission type display device, both the pixel electrode 51 and the facing electrode 53 can be transparent electrodes.

The materials for forming the pixel electrode 51 and the facing electrode 53 are not limited to the materials described above. For example, the pixel electrode 51 and the facing electrode 53 can be formed of a conductive paste containing a conductive organic material or conductive particles of Ag, Mg, Cu, etc. When the conductive paste is used, the paste can be printed by inkjet printing and annealed to form an electrode.

After the OLED is formed, the upper part of the OLED is sealed to substantially prevent exposure to the atmosphere.

In some embodiments, the gate electrode 42, the source electrode 43, and the drain electrode 44 can comprise a metal such as Ag, Mg, Al, Pt, Pd, Au, Ni, Nd, Ir, Cr, Li, Ca, a compound of these metals, or a transparent conductive material, such as ITO, IZO, ZnO or $In_2O_3$ as the conductor described above. Also, the gate electrode 42, the source electrode 43, and the drain electrode 44 can comprise a conductive paste containing a conductive organic material or conductive particles of Ag, Mg, Cu, etc.

Figure 5:
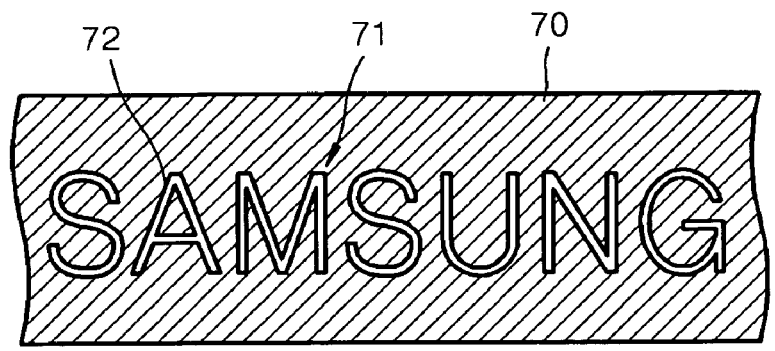
FIG. 5 is a partial enlarged plan view of a panel mark of FIG. 1.

In the OLED according to the embodiment illustrated in FIG. 4, the gate electrode 42 has a single layer structure, the source electrode 43 and the drain electrode 44 have a three-layer structure, but embodiments are not limited to these structures. The gate electrode 42 can also have a three-layer structure. Hereinafter, description will focus mainly on embodiments in which the gate electrode 42 has a single layer structure and the source electrode 43 and the drain electrode 44 have a three-layer structure as depicted in FIG. 5.

The source electrode 43 can have a stacked structure including first, second and third conductive layers 431, 432 and 433, and the drain electrode 44 can have a stacked structure including first, second, and third conductive layers 441, 442, and 443. The second conductive layers 432 and 442 can be formed of aluminum or an aluminum alloy, such as Al, AlSi, AlNd, or AlCu.

When the second conductive layers 432 and 442 are formed of an aluminum group metal, at least one of the first conductive layers 431 and 441 and the third conductive layers 433 and 443 can be formed of at least one material selected from Cr, Cr alloy, Mo, Mo alloy, W, and W alloy.

In one embodiment, the first conductive layers 431 and 441 and the third conductive layers 433 and 443 can comprise molybdenum tungsten (MoW) alloy, and the second conductive layers 432 and 442 can be formed of AlNd alloy.

When the second conductive layers 432 and 442 are formed of an aluminum group metal, at least one of the first conductive layers 431 and 441 and the third conductive layers 433 and 443 can comprise at least one material selected from Ti, a Ti alloy, Ta, and a Ta alloy.

In one embodiment, the first conductive layers 431 and 441 and the third conductive layers 433 and 443 can comprise Ti, and the second conductive layers 432 and 442 can comprise an aluminum group metal.

However, the conductive layers are not limited thereto, and a layer structure can further be included in addition to the three layer structure.

As shown in FIG. 4, when the source electrode 43 and the drain electrode 44 are formed in a multi-layer structure, a cladding unit 45 can be formed of an insulating material to cap the side of the source electrode 43 and the drain electrode 44. When the cladding unit 45 is formed of an organic material, the organic material can comprise a polymer derivative having a phenol group, an acryl group polymer, an imide group polymer, an arylether group polymer, an amide group polymer, a fluorine group polymer, a p-xylyrene group polymer, a vinyl alcohol group polymer, and a composition of more than one of these materials. In some embodiments, the passivation film 35 can be formed of an acryl material, for example, a photosensitive acryl material that can be easily patterned. When the cladding unit 45 is formed of an inorganic material, the inorganic material can comprise at least one of $SiO_2$, $SiN_x$, SiON, $Al_2O_3$, $TiO_2$, $Ta_2O_5$, $HfO_2$, $ZrO_2$, Barium Strontium Titanate (BST), and PZT.

As described above, since the source electrode 43 and the drain electrode 44 have a multilayer structure, the overall conductivity of the source electrode 43 and the drain electrode 44 can be improved. This occurs because the second conductive layers 432 and 442 are formed of an aluminum group metal having high conductivity. The second conductive layers 432 and 442 are protected by the first conductive layers 431 and 441 and the third conductive layers 433 and 443. The multilayer structure may also be used for electrically operative lines other than power lines, such as signal lines, control lines, and shielding lines. Also, the cladding unit 45 can prevent the second conductive layers 432 and 442 formed of an aluminum group metal from being corroded or etched due to the penetration of an etchant through the side surfaces of the source electrode 43 and the drain electrode 44. The cladding unit 45 is particularly useful for protecting the source electrode 43 and the drain electrode 44 from the penetration of an etchant when the pixel electrode 51 is patterned. The cladding may also be used for electrically operative lines other than power lines, such as signal lines, control lines, and shielding lines.

Another embodiment is a Vdd line 20 can also be formed when the source electrode 43 and the drain electrode 44 are formed. The Vdd line formed at the same time as the source electrode 43 and the drain electrode 44 also has a first conductive layer 201, a second conductive layer 202, and a third conductive layer 203. The first conductive layer 201, the second conductive layer 202, and the third conductive layer 203 can be formed of the same materials described above.

Another embodiment is a cladding unit 25 can also be formed in the Vdd line 20 as described above. The function of the cladding unit 25 is the same as that of the cladding unit 45, thus a detailed description thereof will be omitted.

When the source electrode 43 and the drain electrode 44 are formed, a plurality of conductors can be formed in addition to the Vdd line 20 in the pixel. For example, the driving power bus line 21 and the electrode power bus line 22 shown in FIG. 1 can be formed at the same time.

In some embodiments, a metal layer 70 overlaps the driving power bus line 21 and connects electrically to the driving power bus line 21. The metal layer 70 can be formed, for example, adjacent to the driving power bus line 21 and have a length substantially corresponding to the driving power bus line 21. The metal layer 70 may be long enough to reduce the voltage drop of the driving power bus line 21, which will be described later.

As seen in FIG. 4, the metal layer 70 can be formed at the same time as the gate electrode 42 of the TFT 40, and accordingly, can be formed of the same materials as the gate electrode 42.

The metal layer 70 may have a width W1 smaller than the width W2 of the driving power bus line 21. Accordingly, as shown in FIG. 1, the metal layer 70 can be completely covered by the driving power bus line 21. Accordingly, unused area is not increased by metal layer 70.

The metal layer 70 may be used to form a panel mark 71 which is an indentification mark for identifying the panel. As shown in FIG. 5, the panel mark 71 can be formed with openings 72 by engraving the metal layer 70, but other techniques may also be used. For example, a mark can be engraved on the metal layer 70 using a laser etc.

Figure 6:
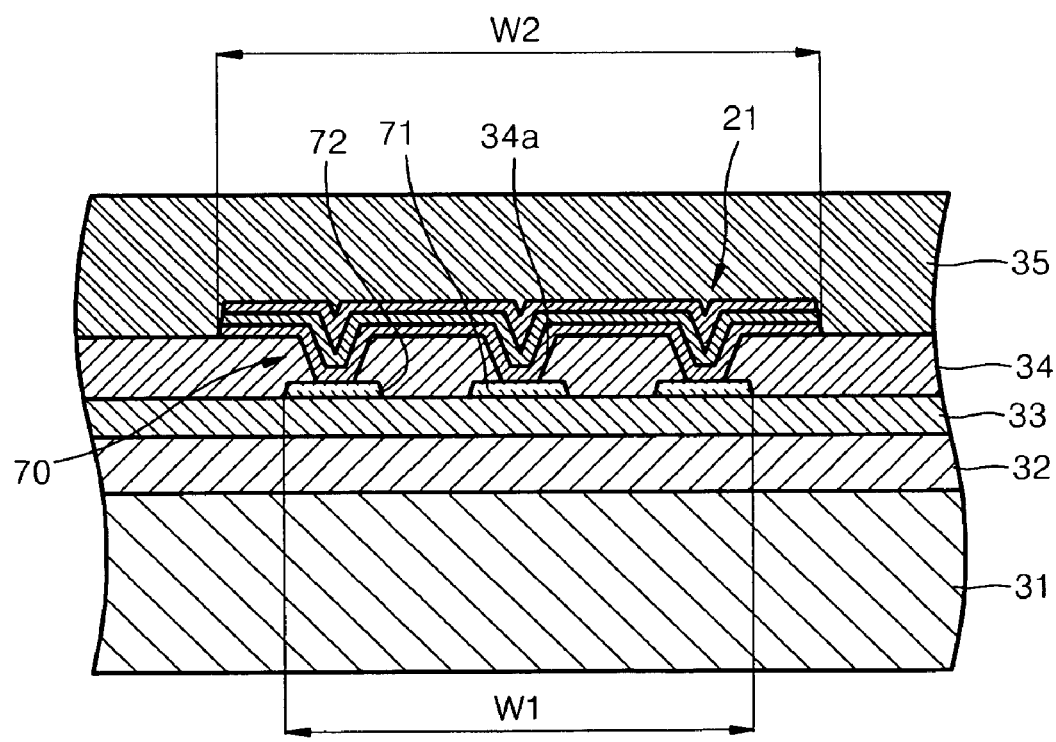
FIG. 6 is a cross-sectional view taken along line VI-VI of FIG. 1.

Referring to FIG. 6, the metal layer 70 is separated from the driving power bus line 21 by an interlayer insulating film 34 interposed therebetween. However, contact holes 34a are formed in the interlayer insulating film 34 so that the driving power bus line 21 can contact the metal layer 70. Accordingly, the metal layer 70 and the driving power bus line 21 are electrically connected, thereby reducing sheet resistance. Accordingly, the IR drop, i.e. voltage drop of the driving power bus line 21 can be reduced.

Figure 7:
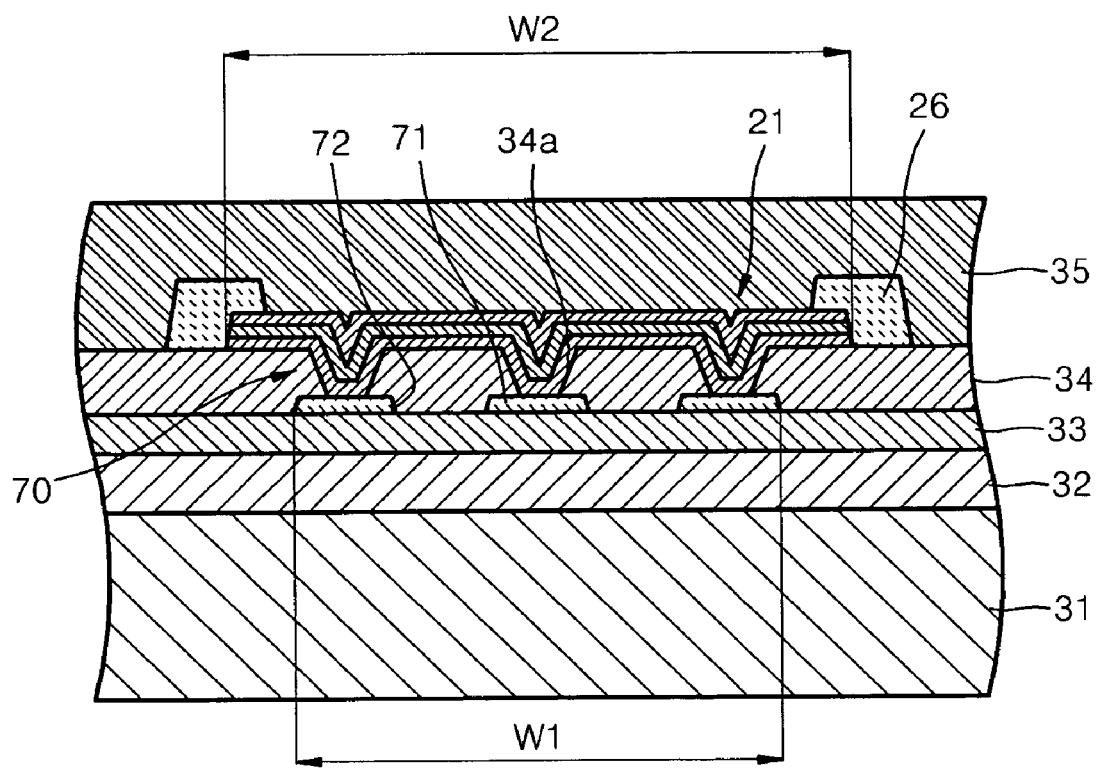
FIG. 7 is a modified version of the cross-section of FIG. 6.

FIG. 7 is a cross-sectional view of a cladding unit 26 on the driving power bus line 21 according to another embodiment. As described above, the cladding unit 26 can prevent an aluminum layer of the driving power bus line 21 from being corroded.

The metal layers 70 according to embodiments depicted in FIGS. 6 and 7 may be formed of the same materials as the gate electrode and may be formed in a single layer, but other configurations may also be used. In some embodiments, the gate electrode and the source and drain electrodes are formed in a structure of more than three layers, and the metal layer 70 can also have a structure of more than three layers. In this case, an additional cladding unit may be included.

Figure 8:
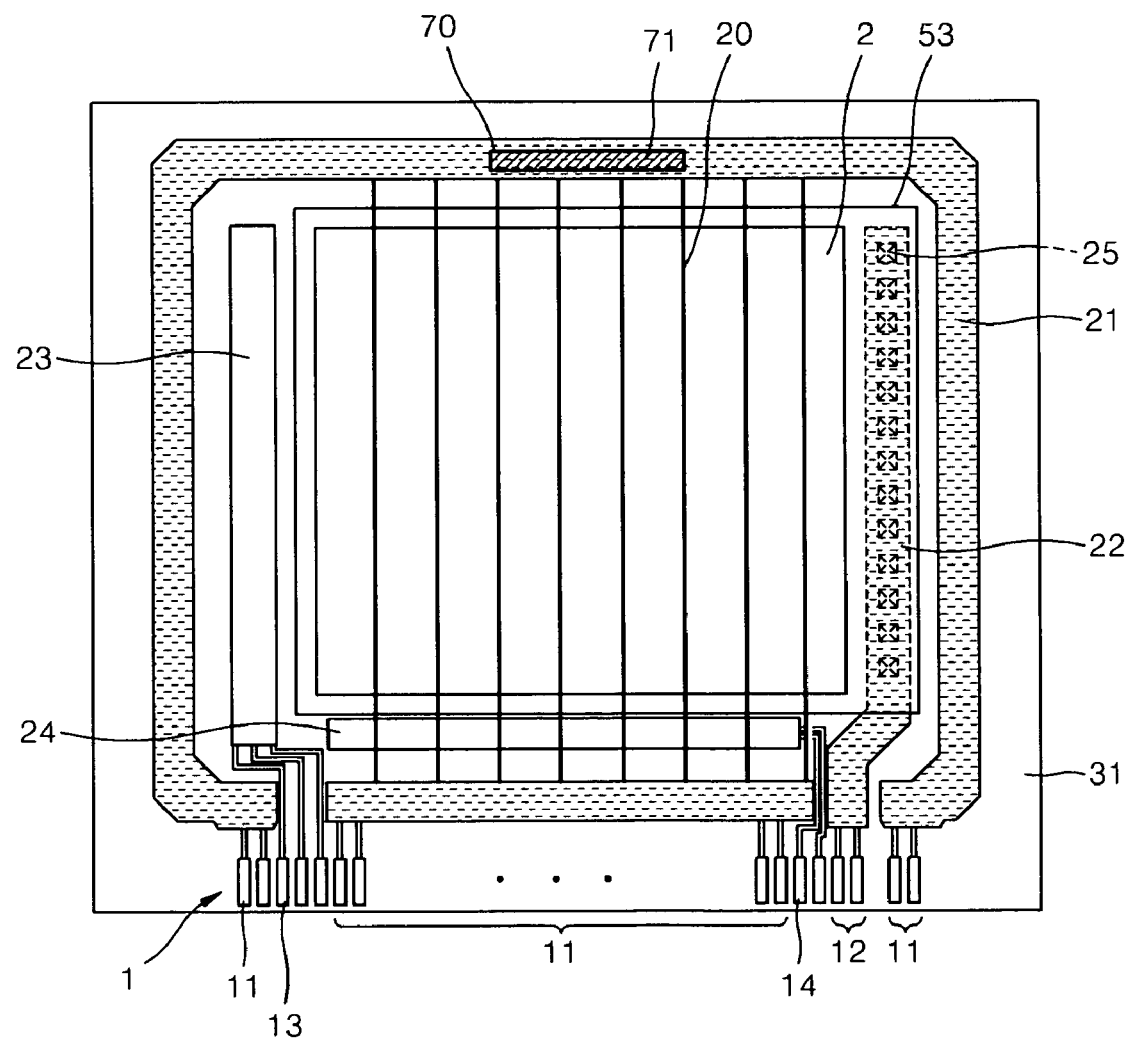
FIG. 8 is a plan view of an organic light emitting display device according to another embodiment.

FIG. 8 is a plan view of an organic light emitting display device according to another embodiment. Referring to FIG. 8, the metal layer 70 can be formed to have a length substantially corresponding to the panel mark 71.

The above embodiments are described with respect to an organic light emitting display device, but the inventive aspects can be applied to various flat panel display devices such as a liquid crystal display.

According to described embodiments, an additional layout for locating a panel indentification mark is unnecessary, thereby reducing the unused area. Various modifications can be made. For example, the mark may be associated with electrically operative lines other than power lines, such as signal lines, control lines, and shielding lines.

The drive voltage drop can also be reduced since the panel identification mark is electrically connected to a driving power bus line.

Another embodiment is a cladding unit covering the side surfaces of a terminal of a pad unit can prevent a conductor from being corroded or etched by an etching solution during a subsequent processing.

While the embodiments described herein have been particularly shown and described with reference to several examples, it will be understood by those of ordinary skill in the art that various changes in form and detail may be made therein without departing from the spirit and scope of the inventive aspects.

What is claimed is:

1. An organic light emitting display device comprising:
   a display region including a plurality of pixels, each pixel comprising:
      a thin film transistor comprising a source electrode, a drain electrode, and a gate electrode,
      an organic light emitting diode electrically connected to the thin film transistor, and
      a VDD line electrically connected to the thin film transistor;
   a driving power bus line located outside of the display region and configured to supply power to the VDD line of each pixel; and
   a metal layer overlapping the driving power bus line and electrically connected to the driving power bus, wherein the metal layer and the driving power bus collectively form a panel mark.

2. The organic light emitting display device of claim 1, wherein an insulating layer is positioned between the metal layer and the driving power bus line, and the metal layer and the driving power bus line contact each other through contact holes formed in the insulating layer.

3. The organic light emitting display device of claim 1,
   wherein the driving power bus line is formed of the same material as the source and drain electrodes of the thin film transistors, and
   the metal layer is formed of the same material as the gate electrodes of the thin film transistors.

4. The organic light emitting display device of claim 1, wherein at least one of the driving power bus line and the metal layer comprises, sequentially stacked, a first conductive layer, a second conductive layer, and a third conductive layer, wherein the second conductive layer comprises at least one of aluminum and aluminum alloy.

5. The organic light emitting display device of claim 4, wherein at least one of the first conductive layer and the third conductive layer comprises at least one of Cr, Cr alloy, Mo, Mo alloy, W, and W alloy.

6. The organic light emitting display device of claim 4, wherein at least one of the first conductive layer and the third conductive layer comprises at least one of Ti, Ti alloy, Ta, and Ta alloy.

7. The organic light emitting display device of claim 1, further comprising a cladding unit configured to cover at least a side of the driving power bus line.

8. The organic light emitting display device of claim 7, wherein the cladding unit comprises at least one of a polymer derivative comprising a phenol group, an acryl group polymer, an imide group polymer, an arylether group polymer, an amide group polymer, a fluorine group polymer, a p-xylyrene group polymer, a vinyl alcohol group polymer, and a combination of these materials.

9. The organic light emitting display device of claim 7, wherein the cladding unit comprises an inorganic material.

10. The organic light emitting display device of claim 9, wherein the cladding unit is formed of at least one material selected from the group consisting of $SiO_2$, $SiN_x$, SiON, $Al_2O_3$, $TiO_2$, $Ta_2O_5$, $HfO_2$, $ZrO_2$, Barium Strontium Titanate (BST), and PZT.

11. The organic light emitting display device of claim 1, wherein the metal layer is formed within the width of the driving power bus line.

12. The organic light emitting display device of claim 1, wherein the metal layer is located adjacent to the driving power bus line.

13. The organic light emitting display device of claim 1, wherein the metal layer has a length substantially corresponding to the driving power bus line.

14. The organic light emitting display device of claim 1, wherein the panel mark is formed by removing portions of the metal layer.

15. The organic light emitting display device of claim 1, wherein the panel mark is formed by the metal layer.

16. The organic light emitting display device of claim 1, wherein the panel mark is permanent.

* * * * *

UNITED STATES PATENT AND TRADEMARK OFFICE
CERTIFICATE OF CORRECTION

| | | |
|---|---|---|
| PATENT NO. | : 7,919,918 B2 | Page 1 of 1 |
| APPLICATION NO. | : 11/590558 | |
| DATED | : April 5, 2011 | |
| INVENTOR(S) | : Eun-Ah Kim | |

It is certified that error appears in the above-identified patent and that said Letters Patent is hereby corrected as shown below:

At column 6, line 26, please delete "p-xylyrene", and insert -- p-xylylene --, therefor.

At column 7, line 22, please delete "by", and insert -- by the --, therefor.

At column 7, line 24, please delete "indentification", and insert -- identification --, therefor.

At column 7, line 60, please delete "indentification", and insert -- identification --, therefor.

At column 8, line 63, Claim 8, please delete "p-xylyrene", and insert -- p-xylylene --, therefor.

Signed and Sealed this
First Day of November, 2011

David J. Kappos
*Director of the United States Patent and Trademark Office*